United States Patent [19]

Weeks

[11] Patent Number: 5,168,261
[45] Date of Patent: Dec. 1, 1992

[54] CIRCUIT BREAKER SIMULATOR

[76] Inventor: Larry P. Weeks, 10626 Piney Branch Rd., Spotsylvania, Va. 22553

[21] Appl. No.: 863,476

[22] Filed: Apr. 2, 1992

Related U.S. Application Data

[63] Continuation of Ser. No. 571,160, Aug. 23, 1990.

[51] Int. Cl.$^5$ .............................................. G01R 31/32
[52] U.S. Cl. ..................................... 340/515; 340/638; 324/424; 324/73.1; 324/511; 371/16.2
[58] Field of Search ............................... 371/16.2, 20.1; 340/638, 515; 324/424, 418, 503, 504, 506, 511, 544, 73.1, 540

[56] References Cited

U.S. PATENT DOCUMENTS

| | | | |
|---|---|---|---|
| 3,424,979 | 1/1969 | Stocker | 324/384 |
| 3,646,438 | 2/1972 | Staff | 324/503 |
| 3,663,939 | 5/1972 | Olsson | 324/504 |
| 3,852,660 | 12/1974 | Maier . | |
| 3,924,160 | 12/1975 | Maier . | |
| 4,105,965 | 8/1978 | Russell . | |
| 4,209,739 | 6/1980 | Paice . | |
| 4,307,345 | 12/1981 | Schoen . | |
| 4,351,013 | 9/1982 | Matsko et al. . | |
| 4,498,716 | 2/1985 | Ward | 371/20.1 |
| 4,565,963 | 1/1986 | Shaw | 324/503 |
| 4,739,351 | 4/1988 | Feldman | 340/515 |
| 4,803,434 | 2/1989 | Walker . | |
| 4,814,712 | 3/1989 | Burton . | |

FOREIGN PATENT DOCUMENTS

| | | | |
|---|---|---|---|
| 0044098 | 1/1982 | European Pat. Off. | 371/20.1 |
| 0050150 | 3/1982 | Japan | 371/20.1 |

*Primary Examiner*—Kenneth A. Wieder
*Assistant Examiner*—Jose M. Solis
*Attorney, Agent, or Firm*—Cushman, Darby & Cushman

[57] ABSTRACT

A device for testing support equipment for a power circuit breaker, including a breaker simulator for simulating a power circuit breaker, a connector for connecting the breaker simulator to a breaker control panel, and a switch for re-directing the functions of the breaker control panel to the simulator.

11 Claims, 5 Drawing Sheets

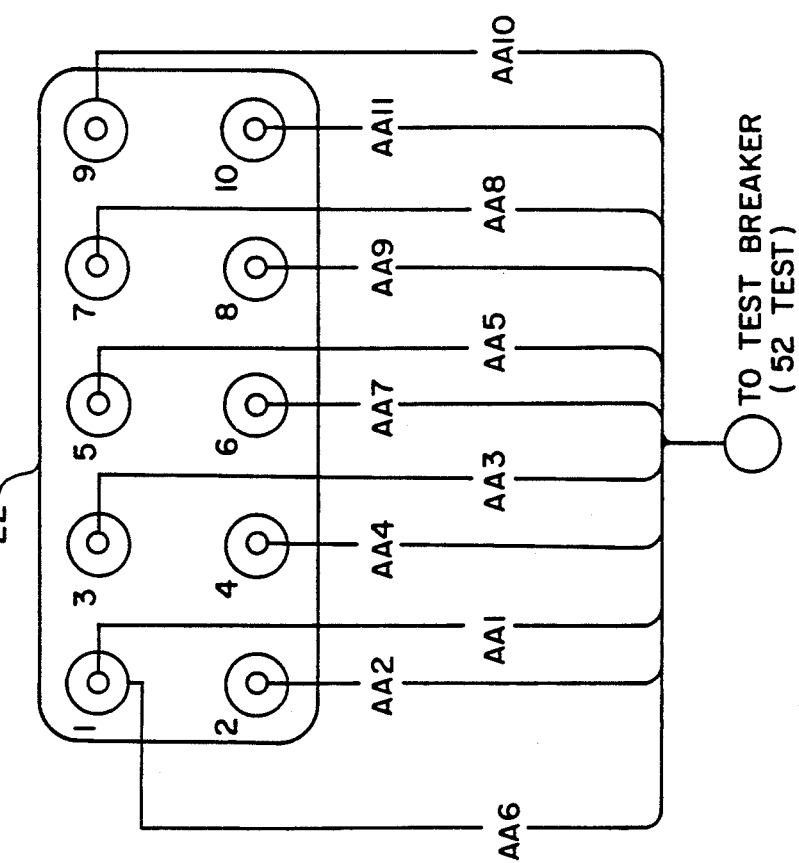

CIRCUIT BREAKER SIMULATOR

This is a continuation of application Ser. No. 07/571,160, filed on Aug. 23, 1990, which was abandoned.

FIELD OF THE INVENTION

The present invention relates to a device for testing support equipment for power circuit breakers in substations and, more particularly, to a method and apparatus for simulating the electrical operation of a power circuit breaker for testing of associated relays and control circuitry.

BACKGROUND OF THE INVENTION

Electric power substations distribute three-phase power from sets of primary transmission lines to one or more sets of secondary lines, which in turn distribute the power to residential, commercial, and industrial loads. The primary transmission lines connect to the secondary lines at a power grid (a.k.a. bus) located within the substation.

Generally, each transmission line connected to the power grid is equipped with a power circuit breaker. These power circuit breakers protect the substation equipment and the entire transmission system from harmful fault currents caused by overloaded or short-circuited transmission lines. Various types of power circuit breakers exist, including air, oil or vacuum, but their operation is generally similar. Pairs of opposing contacts are normally closed to complete the transmission path through the circuit breaker. Sensors monitor the current flowing through the transmission path. These sensors send current level information to protective relay equipment which is centrally located within a control panel. The relay equipment determines whether a fault current exists and, if so, generates and sends a trip signal to the appropriate breaker control equipment also located on the control panel. The breaker control equipment in turn causes the circuit breaker to trip open. The circuit breaker trip operation forces the contacts apart by fluid or air pressure. The circuit breaker is reset by a close operation wherein the contacts are closed in the same manner.

The above-mentioned control panel may be located on the circuit breaker itself, or may be remotely located within a separate walled enclosure within the substation. Here an operator can view and manually control the operation of the circuit breakers.

Regular testing of the relay equipment and breaker control equipment is conducted. During such testing, the transmission line to which the circuit breaker is attached must be disconnected from the power grid while the circuit breaker and support equipment remain operational. An operator then performs a manual test procedure to verify the integrity of the relay equipment and breaker control equipment. The test procedure includes manual operation of the relay equipment and breaker control equipment from the control panel to ensure that the circuit breakers will trip and reclose.

In the past, this testing required tripping and reclosing the circuit breaker at least twelve times over the course of one test procedure. After two such operations the fluid pressure in the circuit breaker would need replenishment. Pressurization involved running a compressor for 30 minutes or more, all of which was time wasted by the operator.

Furthermore, two such test procedures were performed over the course of a year. The tripping and closing of the circuit breakers and charging by a compressor caused excessive wear and tear on this equipment.

In addition, a breaker failure function is built into the control panel to provide back-up relay and control equipment in case of failure of the primary equipment. In order to test the breaker failure function, the operator was required to manually disconnect the primary equipment from the control panel. This was done by unscrewing the terminal screws and unfastening the wires which connected the equipment inside the control panel. Such testing was unduly time consuming and complex, and created a risk of electric shock to the operator.

There have been no known previous efforts at solving the above-mentioned problems.

SUMMARY OF THE INVENTION

There is provided a means for isolating a power circuit breaker from its associated relay and control equipment, and to substitute therefor a circuit breaker simulator which allows testing in a simple, expedient and risk-free manner.

In a preferred embodiment the present invention comprises a circuit breaker simulator for simulating the electrical operation of a power circuit breaker, a connector for connecting the simulator to a breaker control panel, a switch for electrically isolating the power circuit breaker when the simulator is connected to the breaker control panel and for re-directing a control function of said breaker control panel to the simulator.

Other objects, features, and characteristics of the present invention, as well as the methods and operation and functions of the related elements of the structure, and to the combination of parts and economies of manufacture, will become apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

FIG. 5 is a circuit diagram showing the breaker simulator cable and connections;

FIG. 6 is a rear view of the control panel test receptacle.

DETAILED DESCRIPTION OF THE INVENTION

Figure 1:
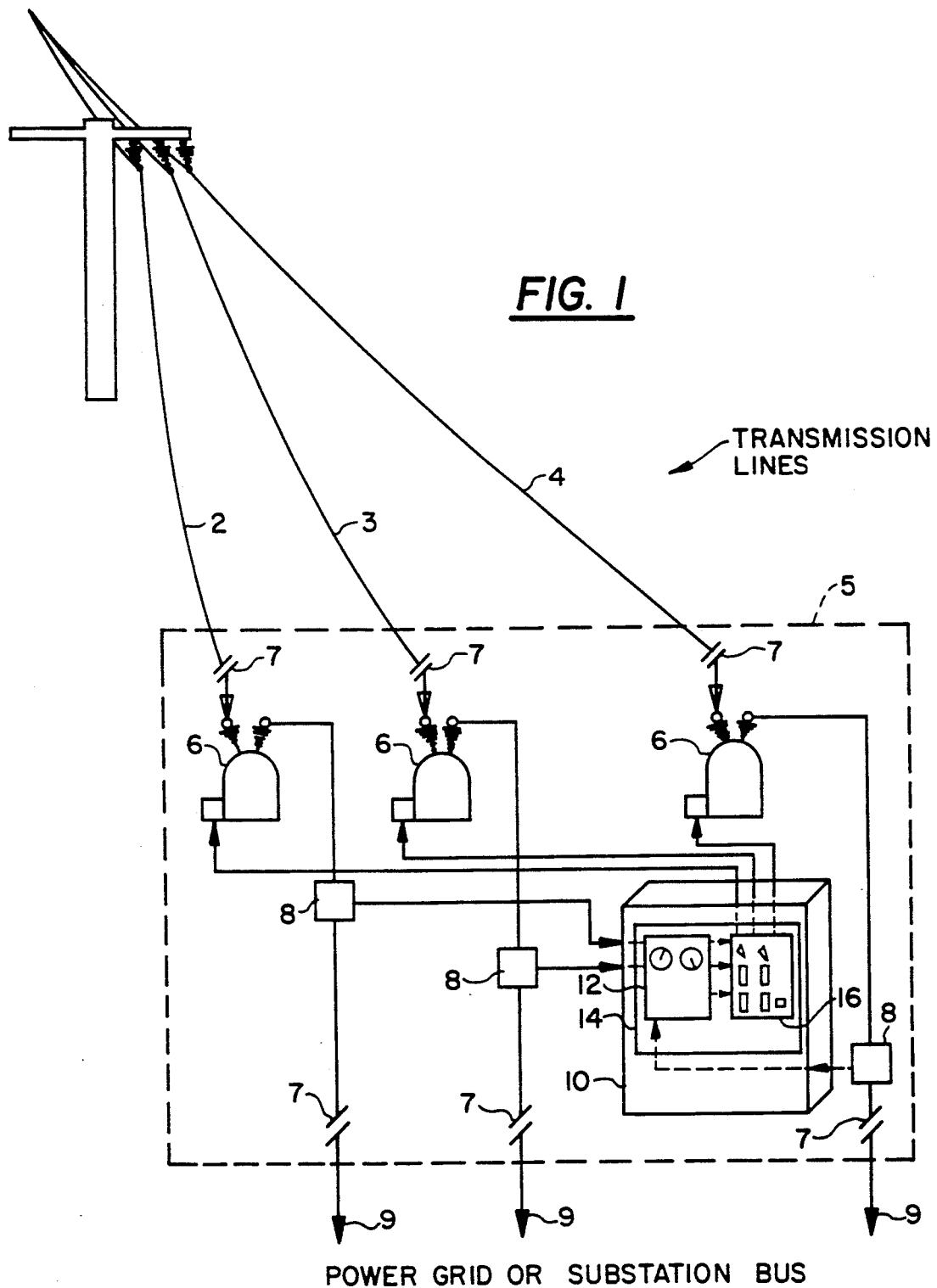
FIG. 1 is a perspective view of power circuit breakers and associated relay and control equipment within a substation.

Referring now to the drawings wherein like numerals designate corresponding parts throughout the several views, there is shown in FIG. 1 a perspective view of a basic circuit breaker arrangement within a power substation.

Three-phase transmission lines 2, 3 and 4 enter the substation 5 and are connected to a power grid 9 through conventional switching circuitry 7, and through a bank of power circuit breakers 6. Sensors 8 monitor each transmission line 2, 3 and 4. Each sensor 8 is an inductive coil which provides a measure of the amount of current flowing through a respective transmission line 2, 3 or 4. This current-level information is provided to protective relays 12 which are located within control panel 16 inside outbuilding 10. Each relay 12 evaluates the current level information provided by a sensor 8 and determines whether a fault condition exists (due to an overloaded or short-circuited transmission line). If a fault condition is found to exist, a trip signal is input to breaker control circuitry 14, which is also located within control panel 16.

Breaker control circuitry 14 controls the trip and reclose operation of the circuit breakers 6 based on the outputs from protective relays 12.

The circuit breakers 6 are most commonly fluid-filled. In operation, the fluid is pressurized by a compressor. Each circuit breaker is equipped with a trip circuit for initiating a trip operation whereby the pressurized fluid forces open a pair of contacts, thereby breaking the transmission line 2, 3 or 4. Each circuit breaker is also equipped with reclose circuitry for automatically initiating a close operation by which the contacts can be brought together after a predetermined period of time, and close circuitry by which the operator can manually initiate a close operation.

Figure 2:
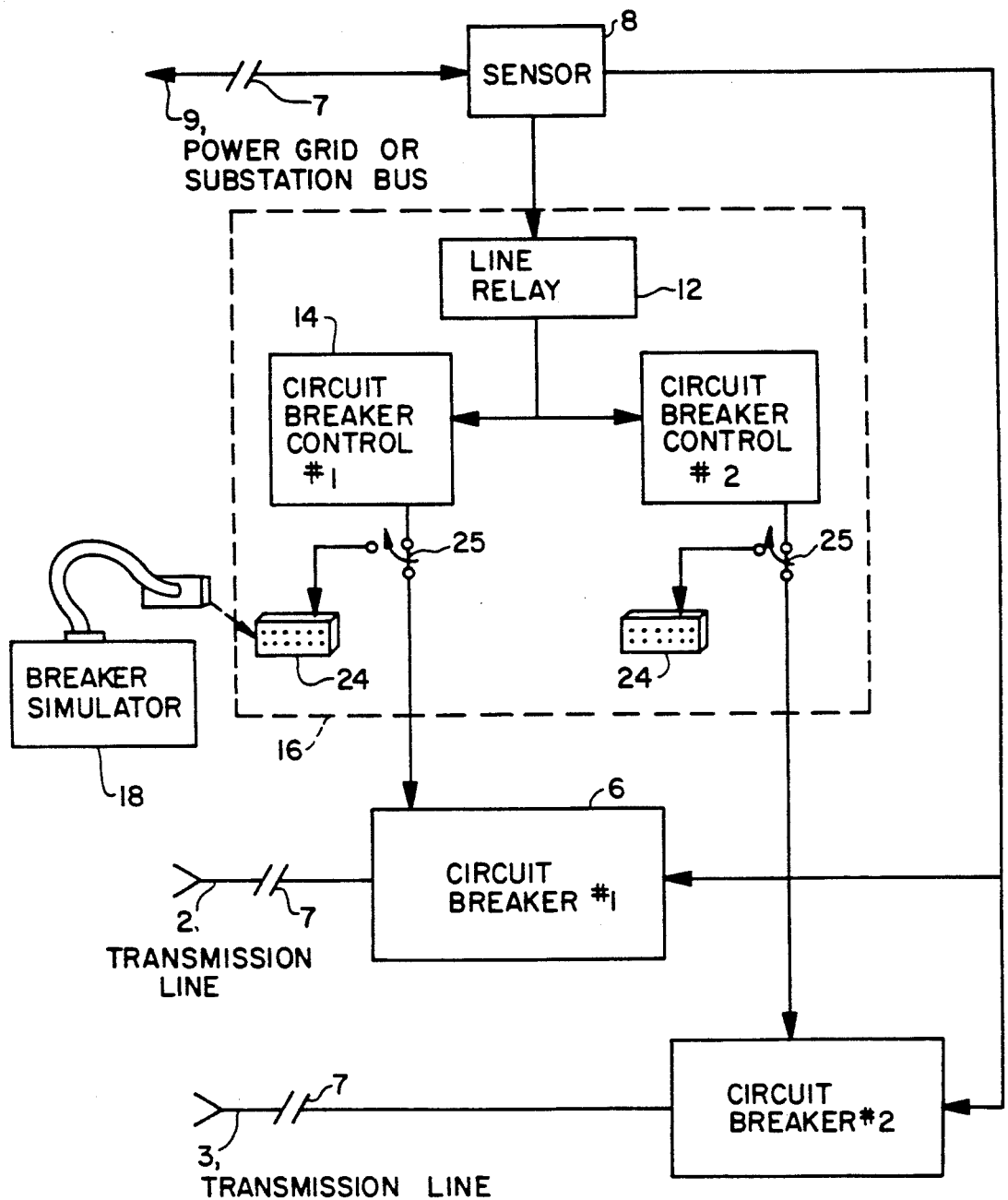
FIG. 2 is a diagrammatic view of the substation of FIG. 1 which details the connection of the breaker simulator according to one embodiment of the present invention.

Turning now to FIG. 2, a diagrammatic view of the power circuit breakers 6, sensor 8, protective relay equipment 12, and breaker control equipment 14 is shown. Also shown is the breaker simulator 18 and manner of connecting the same. The breaker simulator 18 is inserted when an operator desires to test the functioning of the sensors 8, protective relay equipment 12, or breaker control equipment 14. The breaker simulator 18 is plugged into a receptacle 24 mounted on the control panel 16. When the simulator is attached, the circuit breaker 6 is electrically isolated from the control panel, and the control function is redirected from the circuit breaker 6 to the breaker simulator 18.

The breaker simulator 18 is designed to simulate the operation of the circuit breaker 6 such that the control panel 16 can function normally during testing.

Figure 3:
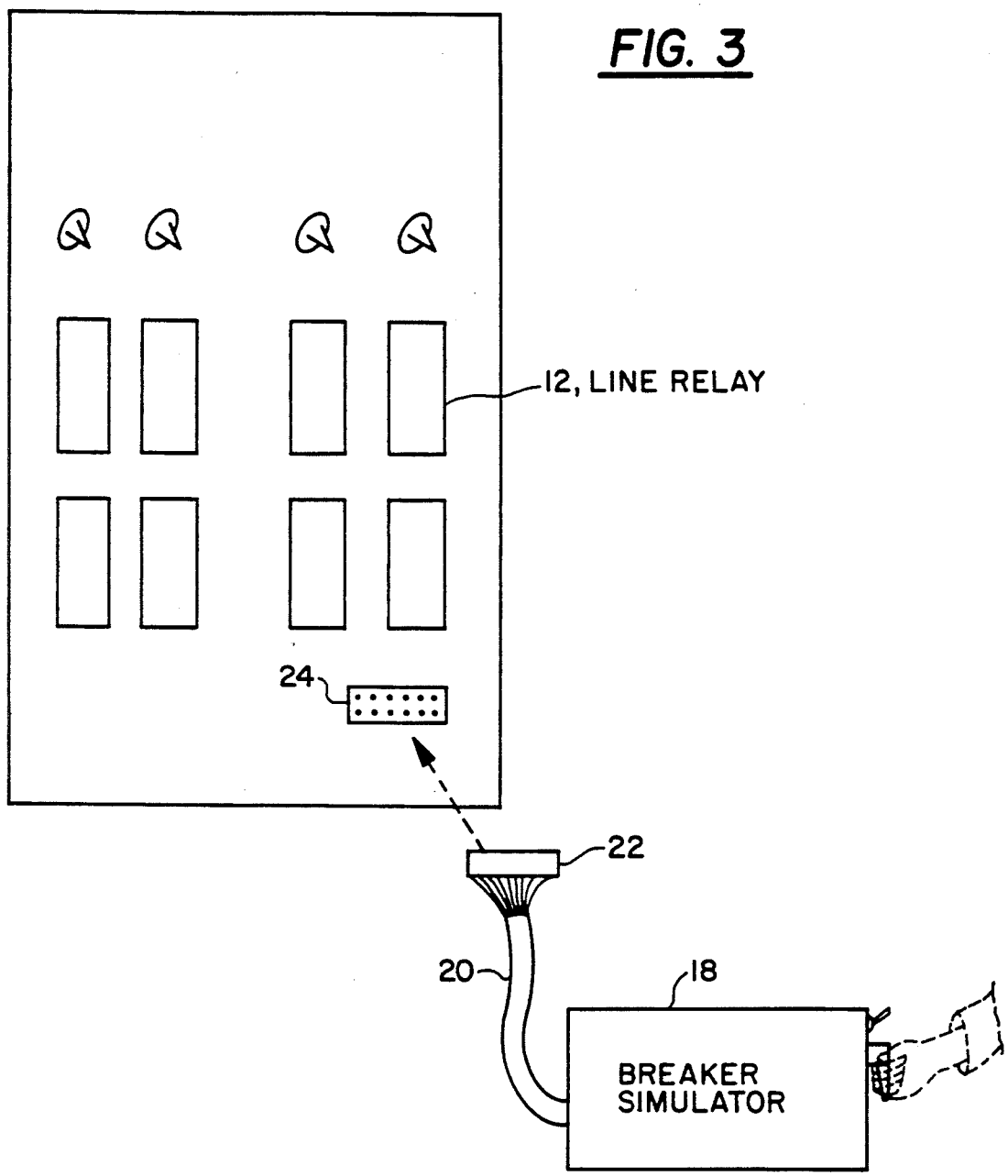
FIG. 3 is a perspective view showing a portable breaker simulator as it attaches to the breaker control panel.

FIG. 3 shows a perspective view of the breaker simulator 18 connected to the control panel 16. An assembly for connecting the circuit breaker simulator to the control panel is provided which includes test cable 20 attached to the face of breaker simulator 18, test plug 22, and test receptacle 24 mounted on the front of control panel 16 and adapted to receive test plug 22.

The breaker simulator 18 can be manipulated externally by controls located on its face plate. These controls allow the operator to simulate different aspects of the actual circuit breakers 6.

Figure 4:
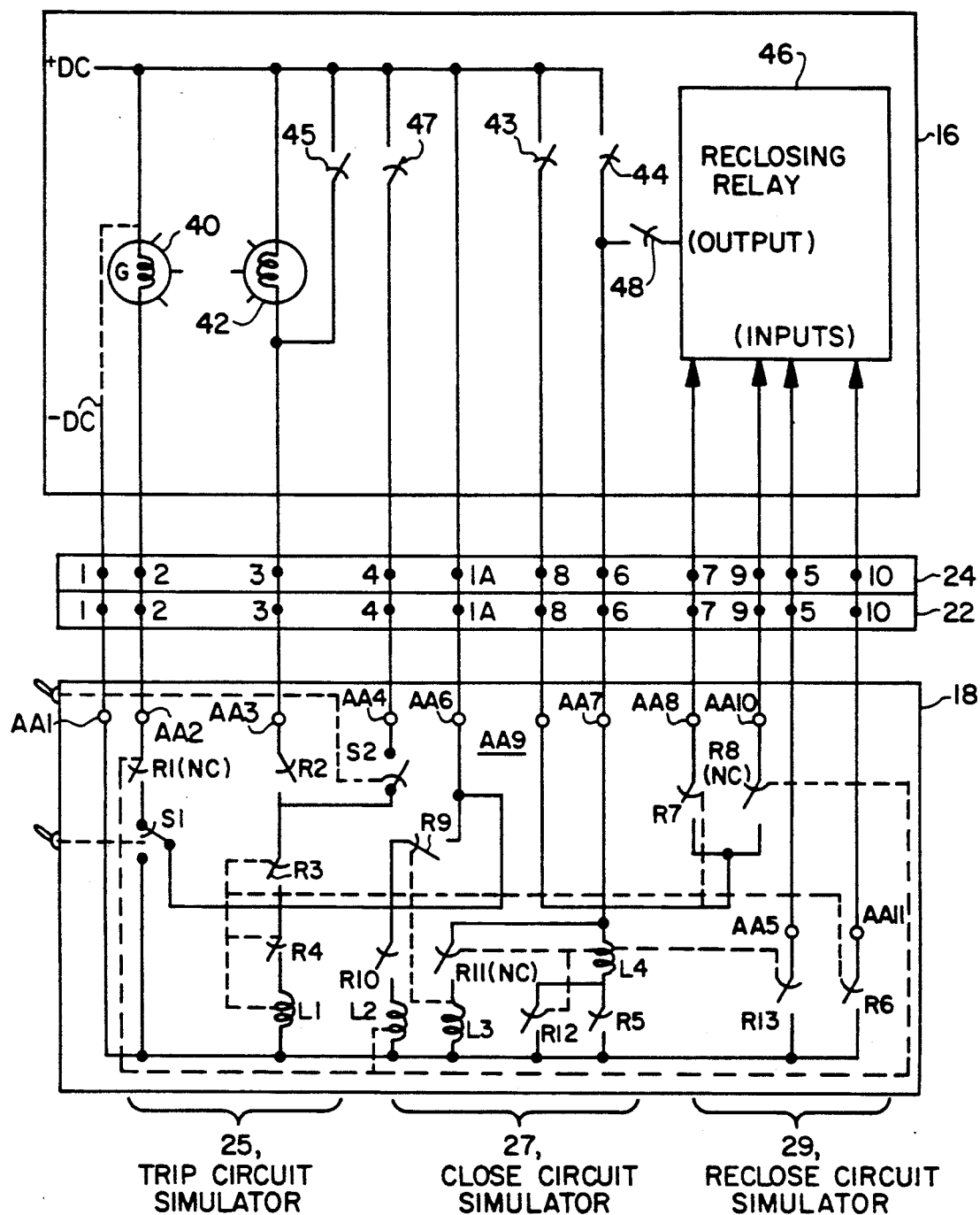
FIG. 4 is a circuit diagram of the circuit breaker simulator as it connects to the protective relay equipment 12.

FIG. 4 is a schematic diagram of the circuit breaker simulator 18 as it connects to the protective relay equipment 12 within control panel 16. The simulator 18 comprises one General Electric type H.E.A. electrical reset lockout relay including eight pair of relay contacts R1-R8, a trip coil L1, and a close coil L2; one General Electric type H.G.A. relay including four pair of relay contacts R9-R12, an X coil L3, and a Y coil L4; a single-pole double-throw switch S1; and a single-pole single-throw switch S2. These components are connected as shown in FIG. 4 via a plurality of terminal plugs AA1-11.

The above-described components can be partitioned into a trip circuit simulator 25 for receiving the relay trip signal from the protective relay equipment 12; a close circuit simulator 27 for receiving the relay close signal from the protective relay equipment 12; and a reclose circuit simulator 29 for outputting reclose signals to the protective relay equipment 12. In addition, relay trip switch S2 interrupts the connection between protective relay equipment 12 and the trip circuit relay coil L1 in order to simulate a circuit breaker having a faulty trip coil.

The protective relay equipment 12 includes a green indicator light 40 which is illuminated when the H.E.A. relay trips, thereby closing R1. However, in some relay equipment 12, this indicator light 40 is connected to −Vdc instead of +Vdc (as shown by the dotted line). The dual positions of switch S1 correspond to these two configurations, and allow testing of the green indicator light regardless of the configuration.

FIG. 5 illustrates the wiring connections between terminal posts AA1-11 of the breaker simulator and test plug 22.

FIG. 6 details the test receptacle 24 which is mounted on control panel 16. The test receptacle 24 normally has conventional G.E. style paddle plugs inserted to maintain the control function of the breaker control panel 16 to the power circuit breaker 6. When these paddle plugs are removed, then the test receptacle 24 receives test plug 22 in either of two slots, thereby completing the connection of the breaker simulator 18 to the breaker control panel 16 (and support equipment housed therein). The lower slot aligns test plug 22 with connectors 1-10A, while the upper slot aligns test plug 22 with connectors 11-20A. Test plug 22 is normally attached to the lower slot for simulating the primary functions of a circuit breaker. However, circuit breakers may be equipped with a back-up trip circuit for operation when the primary trip circuit fails. A back-up trip circuit can be simulated by inverting test plug 22 and inserting it into the upper slot. Regardless of which slot is used, when the test plug 22 is inserted into the receptacle 24, power circuit breaker 6 is switched out of the system, and the breaker simulator 18 is substituted therefor. Both receptacle 24 and the switch 25, which is part of connector receptacle 24, are standard equipment which are factory-installed on the control panel 16 for the purpose of calibrating the relay equipment 12.

A preferred method of testing the relays and circuit breaker control circuitry contained within the control panel will be described with reference to FIG. 4. First, the power circuit breaker 6 is disconnected from the power grid. The plug 22 of breaker simulator 18 is then plugged into receptacle 24 located on the control panel 16. All primary circuit breaker functions are thereby redirected to the circuit breaker simulator 18. Initially, the H.E.A. relay will be in a closed position and contacts R2-R7 will be closed, while contacts R1 and R8 will be open. At this point, the operator may begin to operate breaker simulator 18 to ensure that the relay equipment 12 and breaker control circuitry 14 functions properly.

First, the relay trip operation is tested by the relay trip circuit 25. Switch S1 is placed in the proper position, and switch S2 is open. A small current will flow through trip coil L1, and red indicator 42 will illuminate (indicating that the H.E.A. breaker is closed and can be tripped). Switch S2 and relay contact 47 are then closed. This will increase the current flowing through trip coil L1 thereby tripping the H.E.A. relay. Contacts R1 and R8 will close, and contacts R2-R7 will open. Red indicator 42 will extinguish, and green indicator 40 will illuminate to indicate that the breaker is open.

The relay close operation is then tested by close circuit 27. Relay 44 is a manual close type relay operable from the control panel. When closed, relay 44 allows current to flow to the X and Y coils of the H.G.A. relay L3 and L4, respectively. This causes R9 and R10 to close, and close coil L2 is energized, thereby resetting the H.E.A. relay. The correct operation can be verified from the indicator lights 40 and 42.

The relay reclose operation is designed to automatically close the H.E.A. relay after a predetermined period of time. This function is tested by reclose circuit 29. The reclosing relay 46 senses when a relay trip has occurred from the position of contacts R7 and R8. After a set delay, the reclose relay 46 causes contacts 48 to close, and current is injected to the X and Y coils of the H.G.A. relay L3 and L4, respectively. This causes R9 and R10 to close, and close coil L2 is energized, thereby resetting the H.E.A. relay. Contacts R7 and R8 return to their normal positions, signalling the reclosing relay 46 to open contact 48. The correct operation can be verified from the indicator lights 40 and 42.

In this manner all relay equipment 12 and breaker control equipment 14 (including back up systems) can be thoroughly tested without operating the power circuit breakers 6. Also, simulated breaker failure faults can be inserted simply by activating the relay trip switch S2 which is mounted on the face of the breaker simulator 18, as opposed to the former method of disconnecting wires from within the control panel.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What I claim is:

1. A test assembly for testing a breaker control panel which operates to monitor and control a power circuit breaker in an electric power substation, said power circuit breaker being disconnected from its associated transmission line and said electric power substation's power grid for said testing, the test assembly comprising:

circuit breaker simulating means comprising trip circuit simulating means for simulating the operation of a trip control circuit of said power circuit breaker and close circuit simulating means for simulating the operation of a close control circuit of said power circuit breaker;

connecting means for connecting said circuit breaker simulating means to said breaker control panel; and switching means for electrically switching said breaker control panel from said power circuit breaker to said circuit breaker simulating means when said circuit breaker simulating means is connected through said connecting means to said breaker control panel so as to electrically isolate said power circuit breaker from the breaker control panel and re-direct monitoring and control functions of said breaker control panel from said power circuit breaker and to said circuit breaker simulating means.

2. The test assembly of claim 1, wherein said connecting means comprises a test cable coupled to one end to said simulating means, a test plug coupled to another end of said test cable, and a test receptacle mounted on said breaker control panel for receiving said test plug, said receptacle being coupled to control equipment in said control panel.

3. The test assembly of claim 1 wherein said circuit breaker simulating means further comprises reclose circuit simulating means for simulating the operation of an automatic reclose control circuit of said power circuit breaker.

4. A portable circuit breaker simulator for simulating electrical operation of a power circuit breaker in an electric power substation so as to test equipment monitoring and controlling said power circuit breaker without operating said power circuit breaker, said power circuit breaker being disconnected from its associated transmission line and said electric power substation's power grid for said testing, said circuit breaker simulator comprising:

means for simulating electrical operation of a trip control circuit in said power circuit breaker to test whether said monitoring and control equipment senses a breaker open condition;

means for simulating electrical operation of a close control circuit in said power circuit breaker in response to a manual close signal from said monitoring and control equipment to test whether said monitoring and control equipment senses a breaker closed condition; and means for electrically connecting said trip circuit simulating means and said close circuit simulating means to the monitoring and control equipment;

said connecting means further comprising means for causing an electrical connection between said monitoring and control equipment and said power circuit breaker to open so as to electrically isolate said power circuit breaker from said monitoring and control equipment.

5. The circuit breaker simulator of claim 4 further comprising:

means for simulating electrical operation of a timed automatic reclose control circuit in said power circuit breaker to test whether said monitoring and control equipment senses a breaker closed condition; and means for connecting said timed automatic reclose circuit simulating means to said monitoring and control equipment.

6. The circuit breaker simulator of claims 4 or 5 wherein said trip circuit simulating means includes a third relay having a coil and a plurality of contacts.

7. The circuit breaker simulator of claim 6 wherein said trip circuit simulating means includes a switch for selectively applying a signal to the coil of said third relay.

8. A method for testing a control panel providing monitoring and control functions to a power circuit breaker in an electric power substation comprising the steps of:

electrically isolating said power circuit breaker from its associated transmission line and said electric station's power grid by disconnecting said power circuit breaker from said transmission line and said power grid;

connecting a power circuit breaker simulator to said control panel, and thereby electrically switching said control panel and said monitoring and control functions of said control panel from said power circuit breaker to said power circuit breaker simulator so as to electrically isolate said power circuit breaker from said control panel and redirect said monitoring and control functions of the control panel to said power circuit breaker simulator;

said power circuit breaker simulator comprising means for simulating electrical operation of a trip control circuit in said power circuit breaker and means for simulating electrical operation of a close control circuit in said power circuit breaker; and performing a test procedure with said power circuit breaker simulator for detecting monitoring and control circuitry faults in said control panel.

9. The method of claim 8, wherein said test procedure step includes detecting faults within a trip control circuit of said control panel, and detecting faults within a close control circuit of said control panel.

10. The circuit breaker simulator of claims 4 or 5 wherein said close circuit simulating means includes a first relay and a second relay, each of said relays having a coil and a plurality of contacts.

11. The method for testing a control panel of claim 8 wherein said power circuit breaker simulator further comprises
means for simulating electrical operation of a timed automatic reclose control circuit in said power circuit breaker.

* * * * *